US 8,044,484 B2

(12) United States Patent
Miura et al.

(10) Patent No.: US 8,044,484 B2
(45) Date of Patent: Oct. 25, 2011

(54) ULTRAVIOLET DETECTING DEVICE AND MANUFACTURING METHOD THEREOF, AND ULTRAVIOLET QUANTITY MEASURING APPARATUS

(75) Inventors: Noriyuki Miura, Kanagawa (JP); Tadashi Chiba, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/915,150

(22) Filed: Oct. 29, 2010

(65) Prior Publication Data
US 2011/0042769 A1      Feb. 24, 2011

Related U.S. Application Data

(62) Division of application No. 12/036,016, filed on Feb. 22, 2008, now Pat. No. 7,843,031.

(30) Foreign Application Priority Data

Mar. 29, 2007 (JP) ................. 2007-089224

(51) Int. Cl.
*H01L 29/78* (2006.01)
(52) U.S. Cl. ........ 257/462; 257/351; 257/431; 257/432; 257/443; 257/461
(58) Field of Classification Search .............. 257/432, 257/443, 351, 431, 461, 462
See application file for complete search history.

(56) References Cited

U.S. PATENT DOCUMENTS 6,852,565 B1 * 2/2005 Zhao ................. 438/73
2002/0153569 A1   10/2002 Katayama

FOREIGN PATENT DOCUMENTS

JP      07-162024      6/1995
JP      2002-314117    10/2002

OTHER PUBLICATIONS

Aryan Afzalian et al., "Physical Modeling and Design of Thin-film SOI Lateral PIN Photodiodes," IEEE Transactions on Electron Devices, vol. 52, No. 5, Jun. 2005 pp. 1116-1122.
Japanese Office Action dated Nov. 18, 2008 with English Translation.

* cited by examiner

*Primary Examiner* — Long Tran
(74) *Attorney, Agent, or Firm* — Volentine & Whitt, P.L.L.C.

(57) ABSTRACT

The present invention provides an ultraviolet detecting device which comprises a silicon semiconductor layer having a thickness ranging from greater than or equal to 3 nm to less than or equal to 36 nm, which is formed over an insulating layer, lateral PN-junction type first and second photodiodes formed in the silicon semiconductor layer, an interlayer insulating film formed over the silicon semiconductor layer, a first filter layer made of silicon nitride, which is formed over the interlayer insulating film provided over the first photodiode and causes light lying in a wavelength range of an UV-B wave or higher to pass therethrough, and a second filter layer made of silicon nitride, which is formed over the interlayer insulating film provided over the second photodiode and allows light lying in a wavelength range of an UV-A wave or higher to pass therethrough.

2 Claims, 11 Drawing Sheets

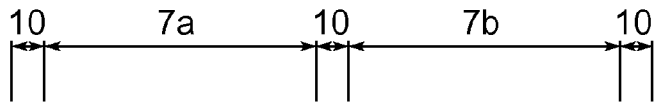
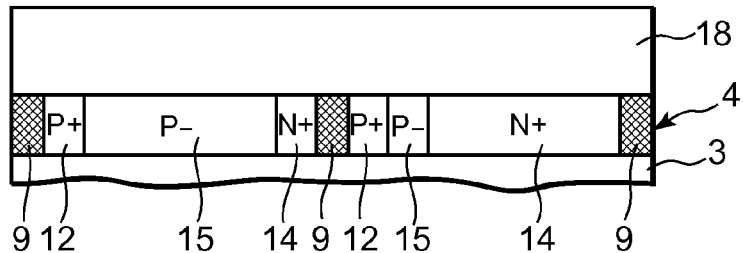
FIG. 3A
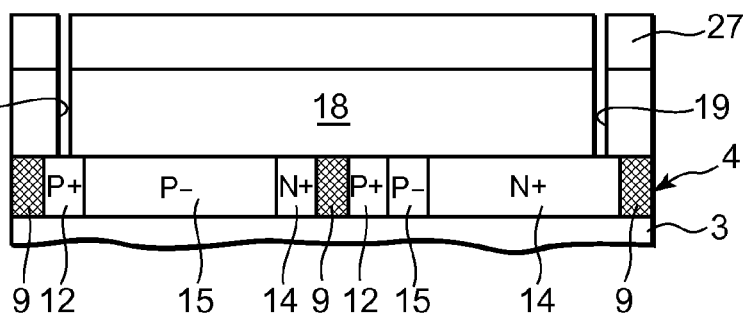
FIG. 3B
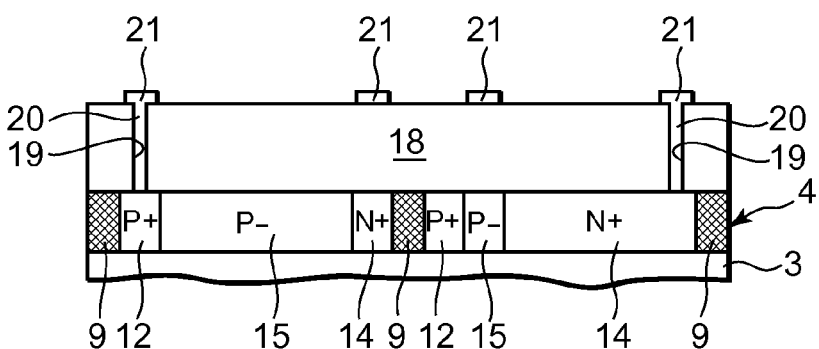
FIG. 3C
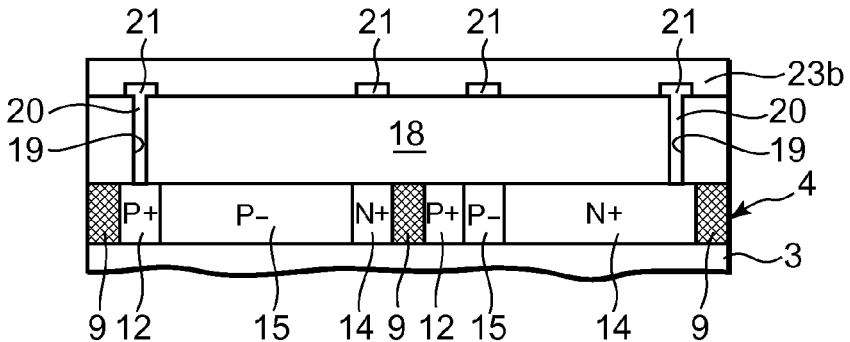
FIG. 3D

FIG. 4A
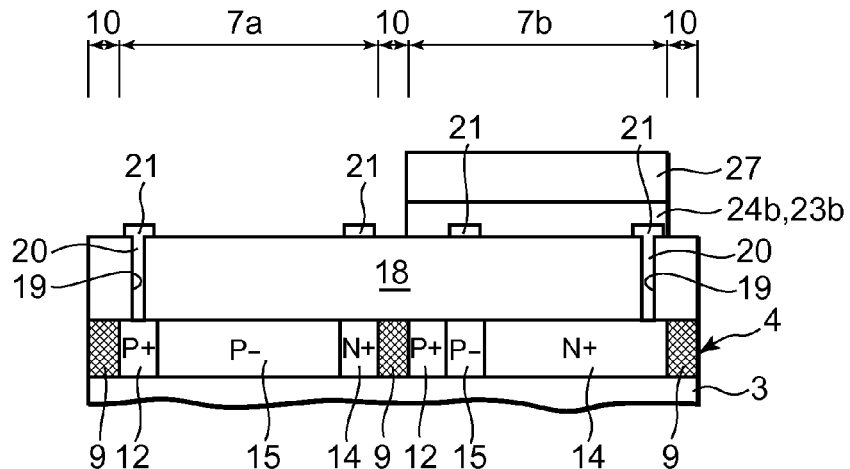
FIG. 4B
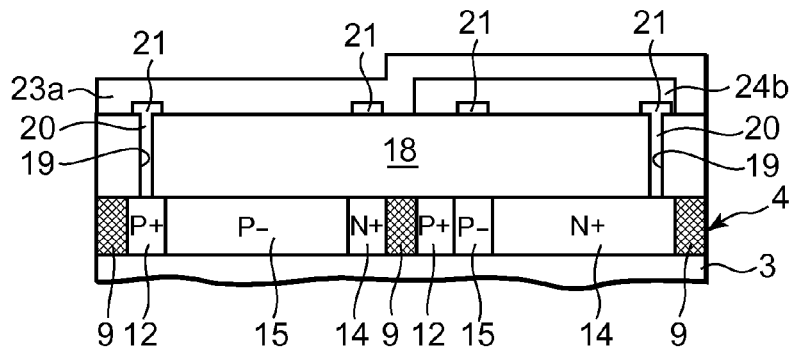
FIG. 4C
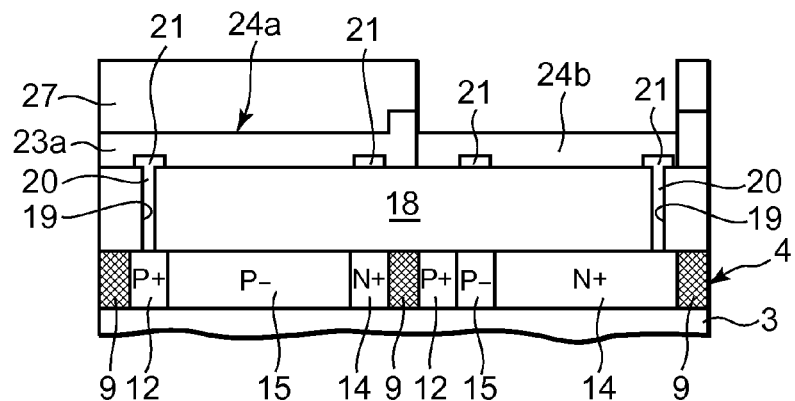

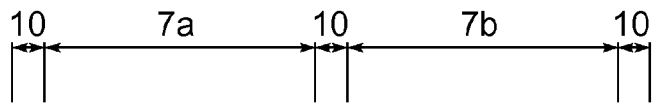
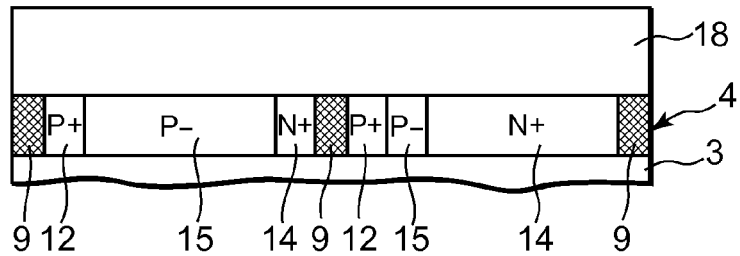
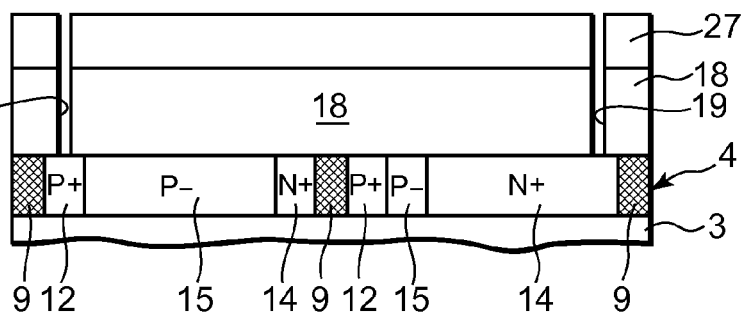
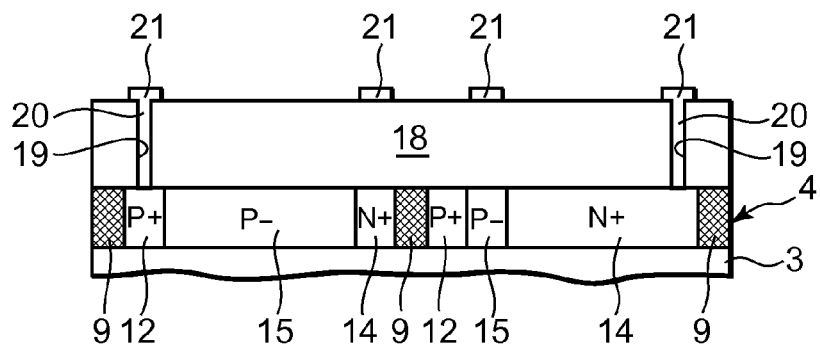
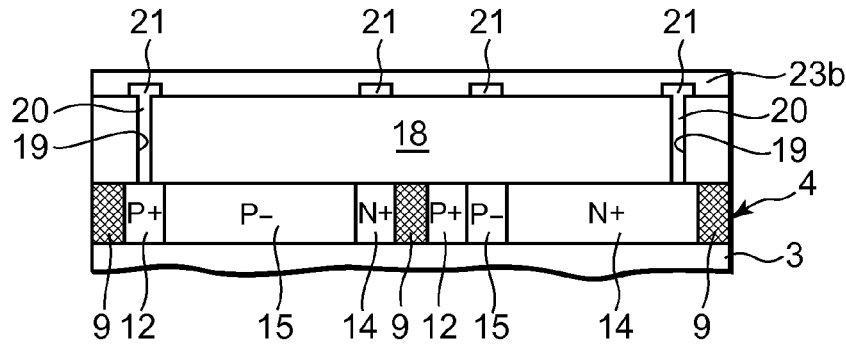

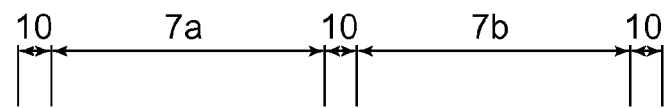
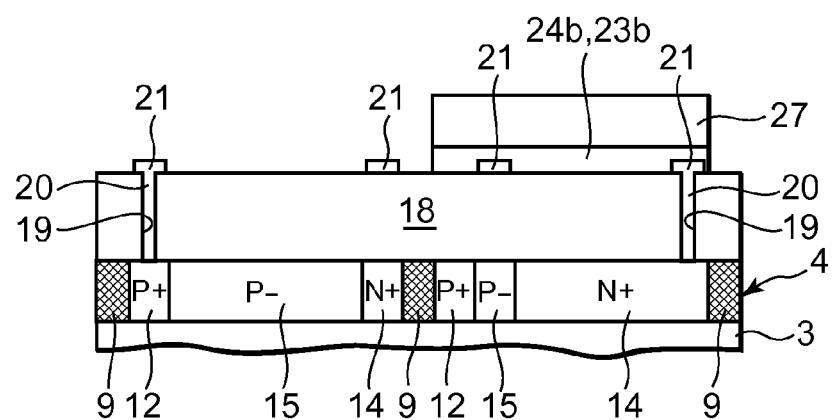
FIG. 12A
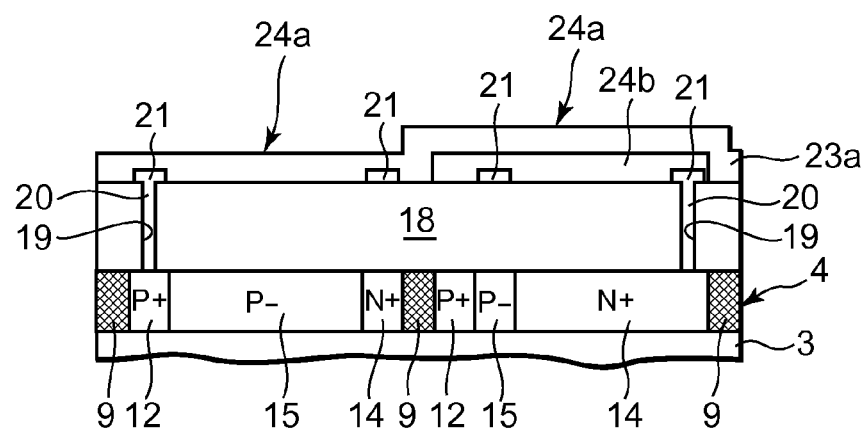
FIG. 12B

ULTRAVIOLET DETECTING DEVICE AND MANUFACTURING METHOD THEREOF, AND ULTRAVIOLET QUANTITY MEASURING APPARATUS

BACKGROUND OF THE INVENTION

The present invention relates to an ultraviolet detecting device using photodiodes that produces currents in light and its manufacturing method, and an ultraviolet quantity measuring apparatus.

In a conventional ultraviolet receiving or detecting device, photodiodes laterally disposed opposite to each other in such a manner that comb teeth portions of both an N+ diffusion layer in which an N-type impurity is diffused in a high concentration and which is shaped in the form of an "E"-shaped comb type, and a P+ diffusion layer in which a P-type impurity is diffused in a high concentration and which is shaped in the form of "π"-shaped comb type, are brought into engagement with each other, are formed in a silicon semiconductor layer with an N-type impurity diffused therein in a low concentration, of a semiconductor wafer of SOI (Silicon On Insulator) structure in which a silicon semiconductor layer of an about 150 nm-thick is formed on a silicon substrate with an embedded oxide film interposed therebetween. A predetermined voltage is applied to wirings electrically connected to the N+ diffusion layer and the P+ diffusion layer to detect the intensity of ultraviolet light (refer to, for example, a patent document 1 [Japanese Unexamined Patent Publication No. Hei 7(1995)-162024 (paragraph 0025 in 4th page—paragraph 0035 in 5th page, FIG. 2 and FIG. 3)]).

With an increase in the exposure dose of ultraviolet light or rays due to destruction of the ozone layer, there has been a growing concern about the influence of ultraviolet light or rays contained in the sunlight on a human body and environments.

In general, the ultraviolet light or rays mean light invisible in an ultraviolet region or range of 400 nm or less in wavelength. The ultraviolet rays are classified into long wave ultraviolet light (UV-A wave: about 320 nm to 400 nm in wavelength), medium wave ultraviolet light (UV-B wave: about 280 nm to 320 nm in wavelength) and short wave ultraviolet light (UV-C wave: about 280 nm or less in wavelength). Influences exerted on the human body and environments differ depending on their wavelength regions or ranges. The UV-A wave causes skin to darken and reaches the inner or true skin, thus resulting in aging. The UV-B wave causes skin irritation and is in danger of inducing skin cancer. The UV-C wave will produce strong bactericidal action. The UV-C wave is however absorbed into the ozone layer and does not reach the ground.

Promptly notifying a daily exposure dose of ultraviolet light presents an important challenge in terms of human-body protection. An UV index that gives an indication of the quantity of ultraviolet light has been introduced in 1995. A recommendation has been made to announce this value together with a weather forecast or the like through mass media.

Such an UV index can be calculated using the CIE action spectrum defined by CIE (Commission Internationale de l'Eclairage) as the relative degree of influence on the human body. The photo-detection characteristic of a UV-B wave strong in the degree of influence on the human body is multiplied by the action spectrum every wavelength. The so-resultant ones are integrated in a wavelength range of the UV-B wave, so that the corresponding UV index can be calculated.

Therefore, there has been growing expectations for development of such a sensor as to separate ultraviolet light or rays lying in two wavelength ranges of UV-A and UV-B waves and detect their intensities.

The prior art referred to above has however a problem in that although the total quantity of ultraviolet light lying in an ultraviolet region or range of 400 nm or less in wavelength can be detected, the two wavelength ranges cannot be detected in separated form.

SUMMARY OF THE INVENTION

The present invention has been made to solve the above problems. It is an object of the present invention to provide an ultraviolet detecting device capable of separating and detecting the quantities of ultraviolet light lying in two wavelength ranges of an UV-wave and an UV-B wave.

It is another object of the present invention to provide an ultraviolet quantity measuring apparatus that measures the respective ultraviolet quantities of an UV-A wave and an UV-B wave.

According to one aspect of the present invention, for attaining the above object, there is provided an ultraviolet detecting device comprising:

a silicon semiconductor layer having a thickness ranging from greater than or equal to 3 nm to less than or equal to 36 nm, which is formed over an insulating layer;

lateral PN-junction type first and second photodiodes formed in the silicon semiconductor layer;

an interlayer insulating film formed over the silicon semiconductor layer;

a first filter layer comprised of silicon nitride, which is formed over the interlayer insulating film provided over the first photodiode and causes light lying in a wavelength range of an UV-B wave or higher to pass therethrough; and a second filter layer comprised of silicon nitride, which is formed over the interlayer insulating film provided over the second photodiode and causes light lying in a wavelength range of an UV-A wave or higher to pass therethrough.

According to another aspect of the present invention, for attaining another object, there is provided an ultraviolet quantity measuring apparatus comprising:

the ultraviolet detecting device referred to above, wherein an ultraviolet quantity of a UV-A wave is determined from an output produced from the second photodiode, and wherein the output of the second photodiode is subtracted from an output produced from the first photodiode to calculate an ultraviolet quantity of a UV-B wave.

Thus, the present invention can bring about an advantageous effect in that an ultraviolet detecting device can be obtained wherein penetrated visible light is cut by the thickness of a silicon semiconductor layer, only the quantities of ultraviolet light lying in wavelength ranges of UV-A and UV-B waves can be outputted from a first photodiode, only the quantity of ultraviolet light lying in the wavelength range of the UV-A wave can be outputted from a second photodiode, and hence the quantities of ultraviolet light lying in the two wavelength ranges of the UV-A and UV-B waves can be separated and detected.

Advantageous effects can be obtained in that ultraviolet information can easily be measured by an ultraviolet quantity measuring apparatus equipped with the above ultraviolet detecting device, and the ultraviolet quantity measuring apparatus can be formed on a single LSI basis, whereby the ultraviolet quantity measuring apparatus can be miniaturized.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3A to FIG. 3D are explanatory diagrams depicting a method for manufacturing the ultraviolet detecting device according to the first embodiment;

FIG. 4A to 4C are explanatory diagrams showing the method for manufacturing the ultraviolet detecting device according to the first embodiment;

FIG. 11A to FIG. 11D are explanatory diagrams depicting a method for manufacturing the ultraviolet detecting device according to the second embodiment;

FIG. 12A to FIG. 12B are explanatory diagrams showing the method for manufacturing the ultraviolet detecting device according to the second embodiment;

DETAILED DESCRIPTION OF THE PREFERRED EMBODIMENTS

Preferred embodiments of an ultraviolet detecting device according to the present invention will hereinafter be described with reference to the accompanying drawings.

First Preferred Embodiment

Figure 1:
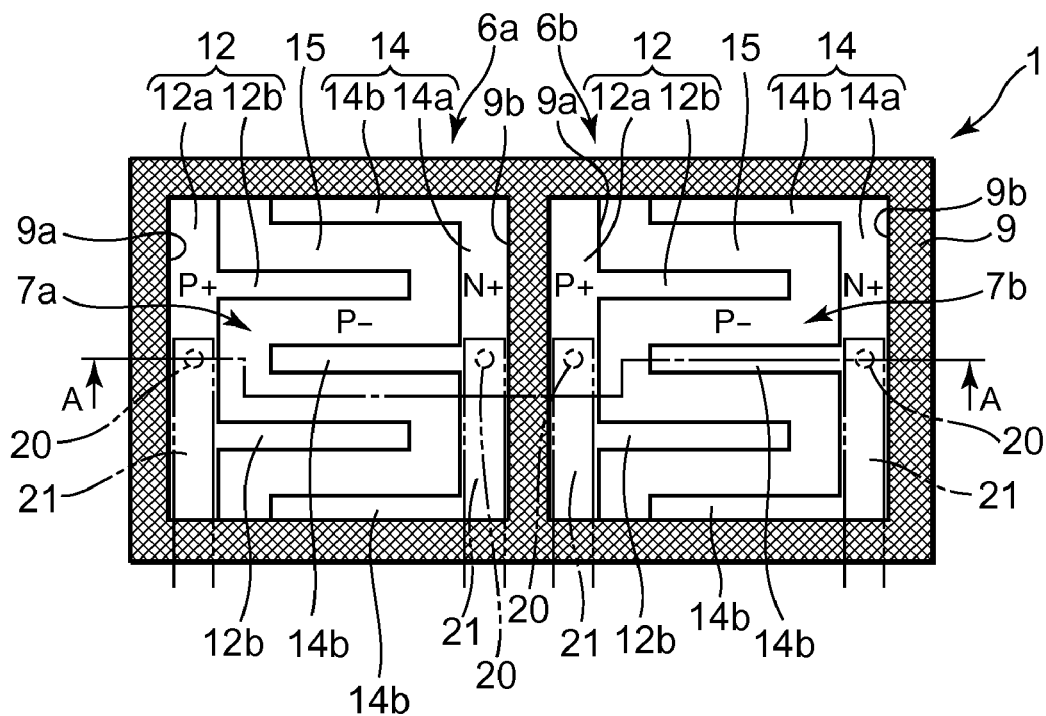
FIG. 1 is an explanatory diagram showing an upper surface of an ultraviolet detecting device according to a first embodiment.
Figure 2:
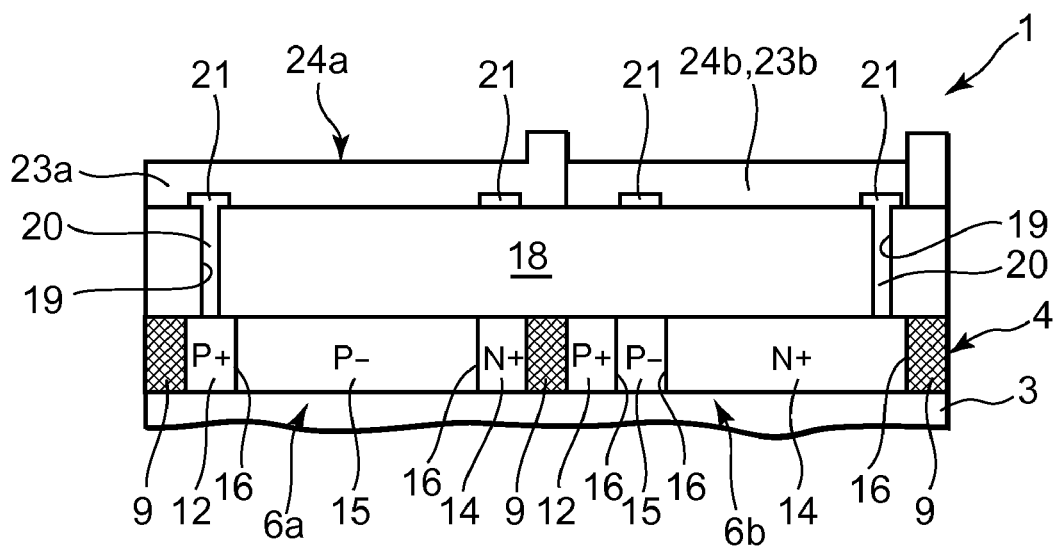
FIG. 2 is an explanatory diagram illustrating a section of the ultraviolet detecting device according to the first embodiment.

FIG. 1 is an explanatory diagram showing an upper surface of an ultraviolet detecting device according to a first embodiment, FIG. 2 is an explanatory diagram showing a section of the ultraviolet detecting device according to the first embodiment, and FIGS. 3A to 3D and FIGS. 4A to 4C are explanatory diagrams showing a method for manufacturing the ultraviolet detecting device according to the first embodiment, respectively.

Incidentally, FIG. 2 is a sectional view taken along sectional line A-A of FIG. 1. FIG. 1 is shown in a state in which each layer above a silicon semiconductor layer shown in FIG. 2 is being eliminated.

In FIGS. 1 and 2, reference numeral 1 indicates an ultraviolet detecting device which comprises lateral PN-junction type first and second photodiodes 6a and 6b formed in a silicon semiconductor layer 4 made of thin monocrystalline silicon (Si), of a semiconductor wafer having an SOI structure in which the silicon semiconductor layer 4 is formed on a silicon substrate made of unillustrated silicon (Si) with an embedded oxide film 3 used as an insulating layer made of silicon oxide ($SiO_2$) being interposed therebetween.

A first diode forming area 7a for forming the first photodiode 6a of the ultraviolet detecting device 1 and a second diode forming area 7b (refer to FIGS. 3A to 3D and FIGS. 4A to 4C) for forming the second photodiode 6b are set onto the silicon semiconductor layer 4 in a state in which they adjoin each other.

Device isolation areas 10 (refer to FIGS. 3A to 3D and FIGS. 4A to 4C) for forming a device isolation layer 9 are set to areas for surrounding the respective peripheries of the first and second diode forming areas 7a and 7b in rectangular frame form.

The device isolation layer 9 is formed in the silicon semiconductor layer 4 for the device isolation areas 10 in a state of having reached the embedded oxide film 3, using an insulating material such as silicon oxide and has the function of electrically insulating and separating between the first and second diode forming areas 7a and 7b.

Incidentally, the device isolation layer 9 is shown with being hatched for distinctions as shown in FIG. 1 and the like in the present description.

The first photodiode 6a of the present embodiment is formed in the first diode forming area 7a set to the silicon semiconductor layer 4.

Reference numerals 12 indicate P+ diffusion layers each used as a P-type high-concentration diffusion layer, which is a diffusion layer formed by diffusing a P-type impurity such as boron (B) into the silicon semiconductor layer 4 of the first diode forming area 7a in a relatively high concentration. As shown in FIG. 1, each of the P+ diffusion layers is shaped in the form of a comb type formed by a ridge portion 12a which contacts one side 9a lying inside the device isolation layer 9, and a plurality of comb teeth portions 12b that extend from the ridge portion 12a to the other side 9b opposite to the one side 9a, lying inside the device isolation layer 9.

The P+ diffusion layer 12 employed in the present embodiment is shaped in an "π"-shaped fashion in such a manner that the two comb teeth portions 12b are extended from the ridge portion 12a.

Reference numerals 14 indicate N+ diffusion layers each used as an N-type high-concentration diffusion layer, which is a diffusion layer formed by diffusing an N-type impurity of a type opposite to the P-type high-concentration diffusion layer, i.e., phosphorus (P) or Arsenic (As) or the like into the silicon semiconductor layer 4 of the first diode forming area 7a. As shown in FIG. 1, the N+ diffusion layer 14 is formed in a comb type formed of a ridge portion 14a that contacts the other side 9b lying inside the device isolation layer 9, and a plurality of comb teeth portions 14b which extend from the ridge portion 14a to the opposite one side 9a.

The N+ diffusion layer 14 employed in the present embodiment is formed in an "E"-shaped fashion in such a manner that the three comb teeth portions 14b are extended from both ends of the ridge portion 14a and its central portion.

Reference numerals 15 indicate P– diffusion layers each used as a low-concentration diffusion layer, which is a diffusion layer formed, with the P-type impurity being diffused therein in a relatively low concentration, in the silicon semiconductor layer 4 that contacts the P+ diffusion layer 12 and the N+ diffusion layer 14 respectively, which are disposed opposite to each other with being spaced from each other in a state in which the comb teeth portions 12b and 14b are engaged with each other. The P– diffusion layer 15 is a portion or region at which electron-hole pairs are generated by ultraviolet light absorbed in a depletion layer formed here.

With the above configuration, the lateral PN-junction type first photodiode 6a of the ultraviolet detecting device 1 according to the present embodiment is formed in such a manner that as shown in FIG. 1, the P+ diffusion layer 12 and the N+ diffusion layer 4 are disposed opposite to each other with the P– diffusion layer 15 interposed therebetween in a state of their comb teeth portions 12b and 14b being engaged with each other, and peripheral edge portions excluding boundaries 16 between both diffusion layers and the P– diffusion layer 15 are brought into contact with the device isolation layer 9.

The lateral PN-junction type second photodiode 6b according to the present embodiment is formed in the second diode forming area 7b set to the silicon semiconductor layer 4 in a manner similar to the first photodiode 6a.

Reference numeral 18 indicates an interlayer insulating film, which is an insulating film of an about 4000 nm-thick formed of silicon oxide, which is formed on the silicon semiconductor layer 4. Portions thereof above the P+ diffusion layers 12 and the N+ diffusion layers 14 of the first and second photodiodes 6a and 6b are removed by etching, so that contact holes 19 each of which reaches the P+ diffusion layer 12 and the N+ diffusion layer 14, are respectively formed.

Reference numerals 20 indicate contact plugs, which are plugs having conductivity formed by embedding a conductive material such as aluminium (Al), tungsten (W), titanium (Ti) or the like into the contact holes 19. Each of the plugs 20 has the function of electrically connecting the P+ diffusion layer 12 and the N+ diffusion layer 14, and each wiring 21.

The wirings 21 are formed on the interlayer insulating film 18 by etching a wiring layer formed of a conductive material similar to the contact plugs 20. The wirings 21 are circuit wirings which electrically connect between the contact plugs 20 and between the contact plugs 20 and unillustrated pads, for example. The wirings 21 are disposed so as not to pass over the P– diffusion layers 15 to avoid interference the sunlight to be received as indicated by a chain double-dashed line in FIG. 2.

Reference numeral 23a indicates a first passivation film, which is a silicon nitride film comprised of silicon nitride ($Si_3N_4$) formed on the interlayer insulating film 18. The first passivation film 23a has the function of protecting the first photodiode 6a, the wirings 21 and the like from external moisture or the like and functions as a first filter layer 24a which allows an area having a size equal to the first diode forming area 7a, which is opposite to the first photodiode 6a with the interlayer insulating film 18 interposed therebetween, to pass ultraviolet light and visible light lying in wavelength ranges of an UV-A wave and an UV-B wave employed in the present embodiment, i.e., light lying in a wavelength range of the UV-B wave or higher.

Reference numeral 23b indicates a second passivation film, which is a silicon nitride film comprised of silicon nitride, formed on the interlayer insulating film 18. The second passivation film 23b has the function of protecting the second photodiode 6b, the wirings 21 and the like from external moisture or the like and functions as a second filter layer 24b which allows an area having a size equal to the second diode forming area 7b, which is opposite to the second photodiode 6b with the interlayer insulating film 18 interposed therebetween, to pass ultraviolet light and visible light lying in a wavelength range of an UV-A wave employed in the present embodiment, i.e., light lying in a wavelength range of the UV-A wave or higher.

In FIGS. 3A to 3D and FIGS. 4A to 4C, reference numeral 27 indicates a resist mask, which is a mask member formed by subjecting a positive or negative resist applied onto the silicon semiconductor layer 4 by photolithography to exposure and development processing. The resist mask functions as a mask for etching and ion implantation in the present embodiment.

Figure 5:
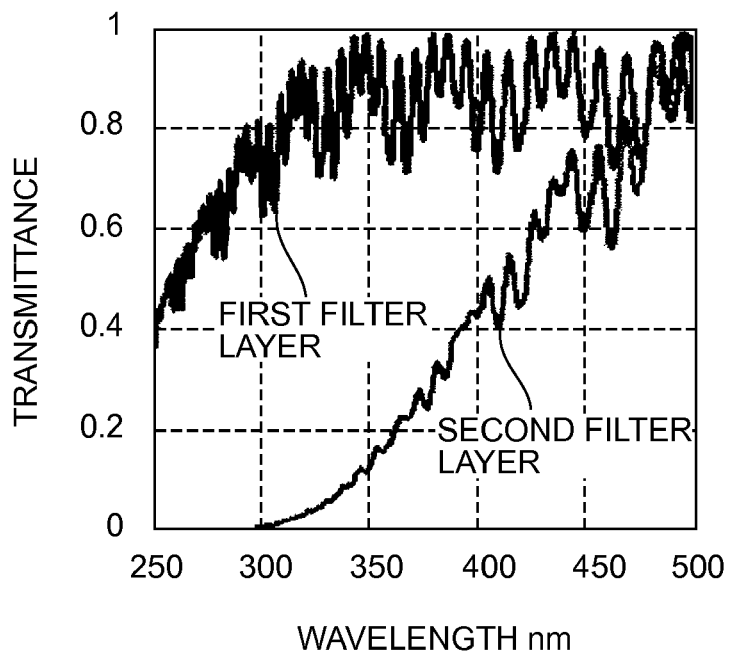
FIG. 5 is a graph illustrating optical transmittance characteristics of first and second filter layers employed in the first embodiment.

The difference in optical absorption characteristic between the first and second filter layers 24a and 24b occurs due to the difference between the quantities of hydrogen (H) contained in their silicon nitride films. The first filter layer 24a low in hydrogen content is formed by a CVD (Chemical Vapor Deposition) method in which a flow rate of monosilane ($SiH_4$), ammonia ($NH_3$), nitrogen ($N_2$) and Argon (Ar) is set to 0.3:7:3:1 under conditions of temperatures from greater than or equal to 350° C. to less than or equal to 450° C. and pressures from great than or equal to 4.0 Torr to less than or equal to 6.0 Torr. The second filter layer 24b higher in hydrogen content than the first filter layer 24a is formed by a CVD method in which the flow rate of monosilane, ammonia, nitrogen and Argon is set to 1.0:7:3:1 under temperature and pressure conditions set in a similar to the above. As shown in FIG. 5, transmittance in a wavelength range of less than or equal to a wavelength of about 280 nm corresponding to the lower limit wavelength of the UV-B wave is lowered to 60% or less in the first filter layer 24a (850 nm-thick) low in hydrogen content, whereas in the second filter layer 24b (850 nm-thick) high in hydrogen content, a wavelength rage of less than or equal to about 320 nm corresponding to the lower limit wavelength of the UV-A wave is cut.

This is because since the energy (N—H binding energy) of binding between hydrogen and nitrogen contained in the silicon nitride film is equivalent to the energy in a wavelength range (about 300 nm), of the UV-B wave, the energy of the UV-B wave is absorbed and the ultraviolet light in the wavelength range of the UV-B wave disappear, when the N—H binding of the silicon nitride film high in hydrogen content for forming the second filter layer 24b (second passivation film 19b) is cut by the energy of the UV-B wave.

Therefore, the first filter layer 24a low in hydrogen content allows the UV-B wave to pass therethrough, and the second filter layer 24b high in hydrogen content allows no UV-B wave to pass therethrough.

Figure 6:
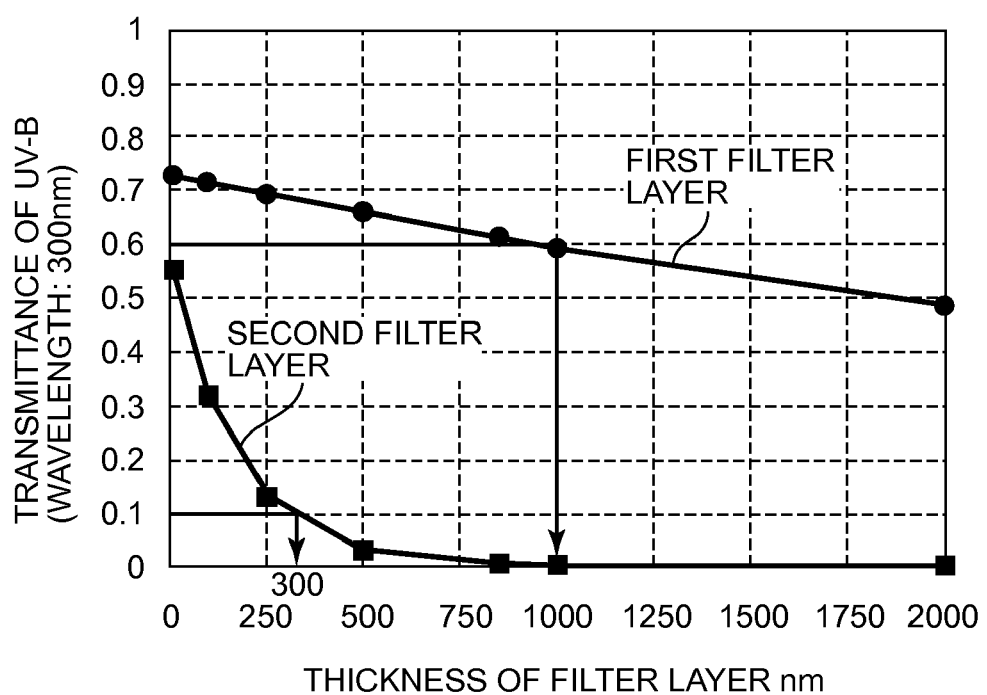
FIG. 6 is a graph showing transmittance of an UV-B wave based on the thicknesses of the first and second filter layers employed in the first embodiment.
Figure 7:
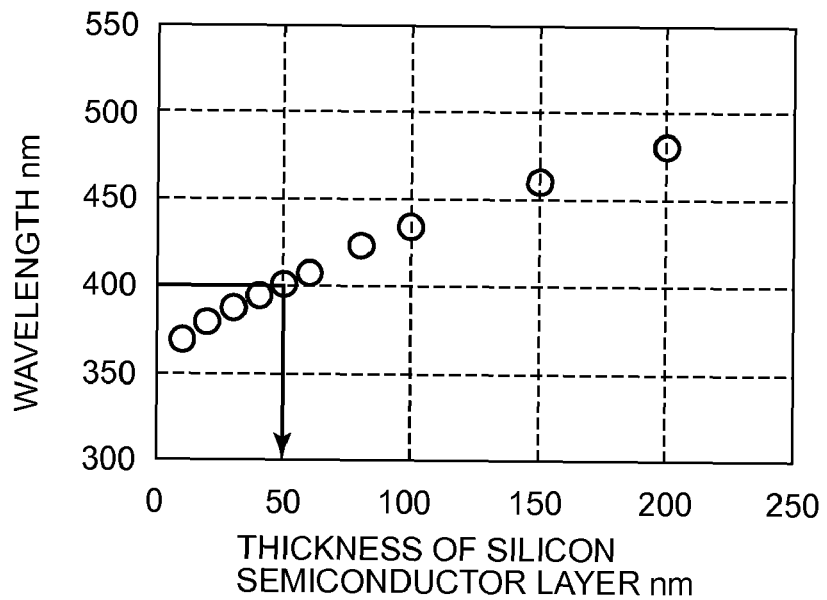
FIG. 7 is a graph illustrating a wavelength at which optical absorptance based on the thickness of a silicon semiconductor layer made of silicon (100) reaches 10%.

As shown in FIG. 6, the transmittance of the UV-B wave 300 nm in wavelength at each of the first and second filter layers 24a and 24b changes depending on its thickness. The first filter layer 24a can ensure a transmittance of 60% or higher at a thickness of less than or equal to 1000 nm in thickness. The second filter layer 24b can yield a transmittance of 10% or less at a thickness of greater than or equal to 300 nm.

Therefore, it is desirable that the plural first and second photodiodes 6a and 6b formed in the semiconductor wafer, and the first and second passivation films 23a and 23b for forming the first and second filter layers 24a and 24b, formed on the interlayer insulating film 18 lying on each unillustrated MOSFET (Metal Oxide Semiconductor Field Effect Transistor) or the like are formed with the same thickness to equalize etching conditions at the formation of terminal holes reaching their corresponding pads after the above formation. It is desirable that in order to ensure the non-penetration characteristic of the UV-B wave at the second filter layer 24b while ensuring the penetrated quantity of UV-B wave at the first filter layer 24a under the same thickness, the thicknesses of the first and second filter layers 24a and 24b are set to the same thickness in the range from greater than or equal to 300 nm to less than or equal to 100 nm.

This is because although the non-penetration characteristic of the UV-B wave at the second filter layer 24b can be ensured when the thickness is set thicker than 1000 nm, the penetrated quantity of UV-B wave at the first filter layer 24a is reduced to less than 60%, whereas although the penetrated quantity of UV-B wave at the first filter layer 24a can be ensured when the thickness is set thinner than 300 nm, the transmittance of the UV-B wave at the second filter layer 24b exceeds 10%, whereby it is difficult to ensure the non-penetration characteristic.

In the present embodiment, the thicknesses of the first and second filter layers 24a and 24b are respectively set to 850 nm.

Incidentally, the thickness of the interlayer insulating film 18 is not limited in particular. The thickness thereof may be a thickness that makes it possible to ensure insulating properties. This is because the extinction coefficient of the interlayer insulating film 18 is 0 and no influence is exerted on optical absorption characteristics.

In order to obtain outputs lying only in an ultraviolet wavelength range from the first and second photodiodes 6a and 6b, there is a need to remove visible-light components from the outputs since the first and second filter layers 24a and 24b employed in the present embodiment allow the visible light to pass therethrough.

Therefore, the present inventors have determined, by calculation, the thickness of the silicon semiconductor layer 4, which makes it possible to detect ultraviolet light or rays selectively, that is, which no reacts to the wavelength rage of the visible light.

That is, optical absorptance I/Io in silicon is represented by the Beer law expressed in the following equation (1):

$$I/Io = \exp(-\alpha Z) \quad (1)$$

where $\alpha$: light or optical absorption coefficient, Z: entrance depth of light, I: light intensity at depth Z, and Io: intensity of incident light It is understood that when the optical absorptance I/Io is determined every thickness (Z) of the silicon semiconductor layer using the equation (1) in consideration of wavelength dependence of the light absorption coefficient $\alpha$, and such a wavelength that the optical absorptance I/Io relative to the thickness of the silicon semiconductor layer 4 becomes 10%, is determined, the thickness of the silicon semiconductor layer 4a may be set to a thickness of 50 nm or less to selectively have or hold sensitivity in the ultraviolet range of 400 nm or less in wavelength.

On the basis of the above result of calculations, photodiodes each having a configuration similar to the first photodiode 6a are singly formed in the silicon semiconductor layer 4 varied in various ways in a range of 50 nm or less in wavelength. Spectral sensitivities of these with respect to the wavelength of light were measured by experiment.

Figure 8:
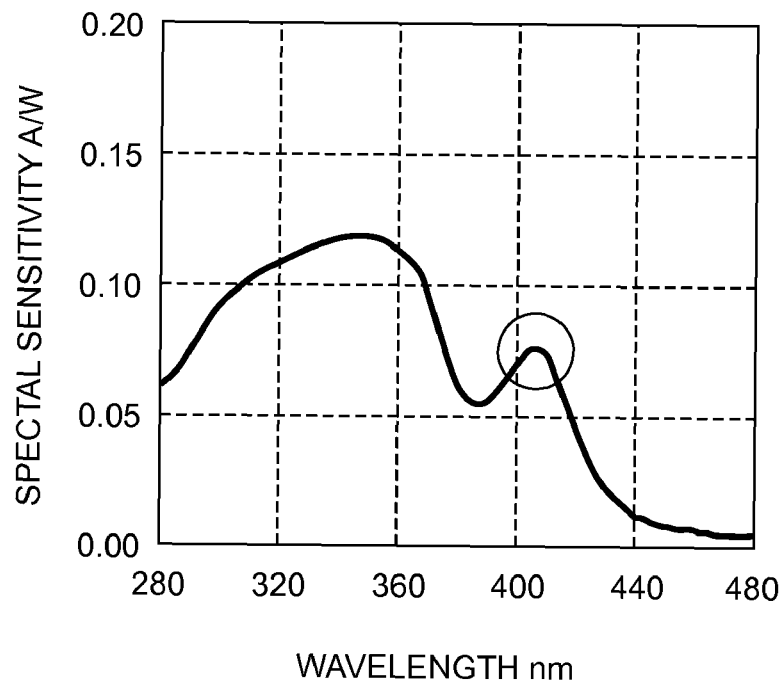
FIG. 8 is a graph showing spectral sensitivity of a photodiode at the time that the thickness of the silicon semiconductor layer is set to 40.04 nm.

FIG. 8 is a graph showing spectral sensitivity of a photodiode at the time that the thickness of the silicon semiconductor layer 4 is set to 40.04 nm.

It is understood that in the photodiode set to about 40 nm in thickness as shown in FIG. 8, a subpeak (marked in a circle shown in FIG. 8) exists in a wavelength range (purple) of visible light longer than the wavelength range (wavelength range of 400 nm or less in wavelength) of ultraviolet light.

It is considered that this is because in the case of an actual photodiode, although the above calculation is made assuming that light passes through the silicon semiconductor layer 4 as it is, light is reflected by the boundary face between the silicon semiconductor layer 4 and the embedded oxide film 3, and the length of a path through which the light passes becomes longer and hence it reacts with visible light having a wavelength longer than the wavelength range of ultraviolet light, so that it appears as a subpeak.

Such a subpeak further appears even at a thin silicon semiconductor layer 4. A result obtained by determining each wavelength (called "subpeak wavelength") that appears thereat by experiment is shown in FIG. 9.

Figure 9:
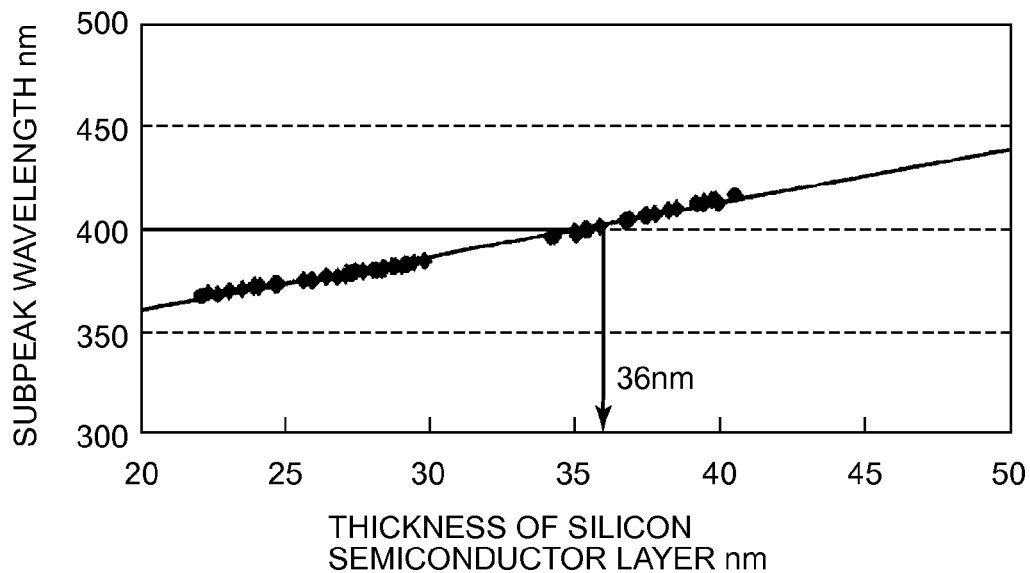
FIG. 9 is a graph illustrating a subpeak wavelength based on the thickness of the silicon semiconductor layer.

As shown in FIG. 9, the subpeak wavelength becomes shorter as the thickness of the silicon semiconductor layer 4 becomes thinner. Assuming that the thickness of the silicon semiconductor layer 4 is Tsi (unit: nm), and the subpeak wavelength is Ls (unit: nm), the subpeak wavelength is made approximate by the following experimental equation. It is understood that in order to avoid the influence of reflection at the boundary face between the silicon semiconductor layer 4 and the embedded oxide film 3 and prevent reaction with visible light having a wavelength longer than a wavelength of 400 nm, the thickness of the silicon semiconductor layer 4 may be set to a thickness of 36 nm or less.

$$Ls = 2.457 Tsi + 312.5 \quad (2)$$

It is therefore desirable that the thickness of the silicon semiconductor layer 4 for selectively detecting only the ultraviolet range is set to 36 nm or less without reacting to the visible light that has penetrated the first and second filter layers 24a and 24b. It is desirable to set its lower limit to 3 nm.

The reason why the thickness of the silicon semiconductor layer 4 is set to greater than or equal to 3 nm is that when its thickness is made thinner than that, it becomes difficult to accommodate variations in the thickness at the time that the silicon semiconductor layer 4 is formed in the semiconductor wafer.

The silicon semiconductor layer 4 of the present embodiment is formed to a thickness of 35 nm.

A method for manufacturing the ultraviolet detecting device according to the present embodiment will be explained below in accordance with processes indicated by P in FIGS. 3A to 3D and FIGS. 4A to 4C.

A silicon semiconductor layer 4 of a semiconductor wafer according to the present embodiment is configured as follows. A sacrifice oxide film is formed, using a thermal oxidation method, in a thin silicon layer of a semiconductor wafer of SOI structure formed by a SIMOX (Separation by Implanted Oxygen) method with a thin silicon layer left on an embedded oxide film 3 or a semiconductor wafer of SOI structure formed with a thin silicon layer attached onto an embedded oxide film 3. This is removed by wet etching. The corresponding semiconductor wafer formed with a silicon semiconductor layer 4 of 35 nm-thick on the embedded oxide film 3 is prepared. A device isolation layer 9 made of silicon oxide that reaches the embedded oxide film 3 is formed in device isolation areas 10 of the silicon semiconductor layer 4 by a LOCOS (Local Oxidation Of Silicon) method.

P-type impurity ions are implanted into first and second diode forming areas 7a and 7b of the silicon semiconductor layer 4 to form P− diffusion layers 15 of first and second photodiodes 6a and 6b formed by diffusing a P-type impurity into the silicon semiconductor layer 4 in a relatively low concentration. A resist mask (not shown) is formed which exposes areas ("E"-shaped portions shown in FIG. 1) for forming respective N+ diffusion layers 14 in the first and second diode forming areas 7a and 7b by photolithography. N-type impurity ions are implanted into the silicon semiconductor layer 4 at the exposed areas for forming the N+ diffusion layers 14 to form the corresponding N+ diffusion layers 14 with the N-type impurity diffused therein in a high concentration.

Next, the resist mask 27 is removed, and a resist mask 27 (not shown) is formed which exposes by photolithography areas ("π"-shaped portions shown in FIG. 1) for forming respective P+ diffusion layers 12 in the first and second diode forming areas 7a and 7b. P-type impurity ions are implanted into the silicon semiconductor layer 4 at the exposed areas for forming the P+ diffusion layers 12 to form the corresponding P+ diffusion layers 12 with a P-type impurity diffused therein in a high concentration. The resist mask 27 is removed and heat treatment or annealing for activating the respective diffusion layers is done, whereby a semiconductor wafer of SOI structure formed with a plurality of lateral PN-junction type first and second photodiodes 6a and 6b in the silicon semiconductor layer 4 is formed.

At FIG. 3A, silicon oxide is deposited relatively thick over the entire upper surface of the silicon semiconductor layer 4 such as over the device isolation layer 9 and the like of the semiconductor wafer prepared in the above-described manner, using a CVD method. Its upper surface is subjected to a flattening or planarization process to form an interlayer insulating film 18.

At FIG. 3B, a resist mask 27 having openings that expose the interlayer insulating film 18 in areas for forming contact holes 19, lying on the P+ diffusion layers 12 and N+ diffusion layers 14 of the first and second photodiodes 6a and 6b is formed on the interlayer insulting film 18 by photolithography. With it as a mask, the corresponding contact holes 19 that extend through the interlayer insulating film 18 and reach the P+ diffusion layers 12 and N+ diffusion layers 14 are formed by anisotropic etching for selectively etching the silicon oxide.

At FIG. 3C, the resist mask 27 formed at the process shown in FIG. 3B is removed, and a conductive material is embedded into the contact holes 19 by a sputtering method or the like to form contact plugs 20. A wiring layer for forming wirings 21 with the same conductive material as the contact plugs 20 is formed on the interlayer insulating film 18. A resist mask 27 (not shown) which covers areas for forming the wirings 21, is formed on the wiring layer by photolithography. With it as a mask, the wiring layer is etched to form the corresponding wirings 21 for electrically connecting between the contact plugs 20, for example, after which the resist mask 27 is removed.

At FIG. 3D, a second passivation film 23b of an about 850 nm-thick comprised of silicon nitride relatively high in hydrogen content is formed over the interlayer insulating film 18 and the wirings 21 by the CVD method under the above conditions.

At FIG. 4A, a resist mask 27 which covers the second diode forming area 7b, is formed on the second passivation film 23b by photolithography. With it as a mask, the second passivation film 23b is etched by anisotropic etching to expose the interlayer insulating film 18 and the wirings 21 lying in areas excluding the second diode forming area 7b.

Thus, a second filter layer 24b having a size equal to the second diode forming area 7b, which is opposite to the second photodiode 6b with the interlayer insulating film 18 interposed therebetween, is formed.

At FIG. 4B, the resist mask 27 formed at the process shown in FIG. 4A is removed, and a first passivation film 23a of an about 850 nm-thick made of silicon nitride relatively low in hydrogen content is formed over the interlayer insulating film 18 and wirings 21, and the second filter layer 24b by the CVD method under the above conditions.

At FIG. 4C, a resist mask 27 that exposes the second diode forming area 7b is formed on the first passivation film 23a by photolithography. With it as a mask, the first passivation film 23a is etched by anisotropic etching to expose the corresponding second filter layer 24b.

Thereafter, the resist mask 27 is removed. A resist mask having openings in areas for forming terminal holes on unillustrated pads is formed by photolithography, and terminal holes are formed by one anisotropic etching, whereby the ultraviolet detecting device 1 shown in FIGS. 1 and 2 is formed which is provided with the first and second filter layers 24a and 24b on the first and second photodiodes 6a and 6b respectively with the interlayer insulating film 18 being interposed therebetween.

The first and second photodiodes 6a and 6b formed in this way do not react to visible light because they are formed in the silicon semiconductor layer 4 whose thickness ranges from greater than equal to 3 nm to less than or equal to 36 nm (35 nm in the present embodiment).

Since the first filter layer 24a that causes the ultraviolet light and visible light lying in the wavelength ranges of the UV-A and UV-B waves to pass therethrough is formed on the first photodiode 6a, the penetrated visible light is cut by the thickness of the silicon semiconductor layer 4, so that only the quantities of the ultraviolet light in the wavelength ranges of the UV-A and UV-B waves can be detected. Since the second filter layer 24b that allows the ultraviolet light and visible light lying in the wavelength range of the UV-A wave to pass therethrough is formed on the second photodiode 6b, the penetrated visible light is cut by the thickness of the silicon semiconductor layer 4, so that only the quantity of the ultraviolet light in the wavelength range of the UV-A wave can be detected.

Thus, if the quantity of the ultraviolet light in the wavelength range of the UV-A wave, which is detected by the second photodiode 6b, is multiplied by predetermined magnifying power and the resultant quantity is subtracted from the quantities of the ultraviolet light in the wavelength ranges of the UV-A and UV-B waves, which are detected by the first photodiode 6a, then the quantity of the ultraviolet light in the wavelength area of the UV-B wave can be determined. Thus, it is possible to obtain such an ultraviolet detecting device 1 as to be capable of separating and detecting the quantities of the ultraviolet light in the respective wavelength ranges of the UV-A and UV-B waves.

Since the first filter layer 24a and the second filter layer 24b are respectively formed with the same thickness (850 nm in the present embodiment) in the range from greater than or equal to 300 nm to less than or equal to 1000 nm, the first and second passivation films 23a and 23b are simultaneously etched under the same etching conditions in the process of forming the terminal holes on the pads and the like, thereby making it possible to simultaneously form a plurality of terminal holes and the like. It is thus possible to simplify the manufacturing process of the ultraviolet detecting device 1.

In the present embodiment as described above, a first filter layer made of silicon nitride, which allows light lying in a wavelength range of an UV-B wave or higher to pass therethrough, and a second filter layer made of silicon nitride, which allows light lying in a wavelength range of an UV-A wave or higher to pass therethrough, are respectively formed on lateral PN-junction type first and second photodiodes formed in a silicon semiconductor layer having a thickness ranging from greater than or equal to 3 nm to less than or equal to 36 nm, formed on an embedded oxide film with an interlayer insulating film being interposed therebetween. Thus, the penetrated visible light is cut off by the thickness of the silicon semiconductor layer, so that only the quantities of ultraviolet light lying in the wavelength ranges of the UV-A and UV-B waves can be outputted from the first photodiode, and only the quantity of ultraviolet light lying in the wavelength range of the UV-A wave can be detected from the second photodiode. It is therefore possible to obtain such an ultraviolet detecting device as to be capable of separating and detecting the quantities of ultraviolet light lying in the two wavelength ranges of the UV-A and UV-B waves.

Since the first filter layer and the second filter layer are respectively formed with the same thickness in the range from greater than or equal to 300 nm to less than or equal to 100 nm, a plurality of terminal holes or the like lying on pads can be formed simultaneously by etching the first and second passivation films simultaneously under the same etching conditions, thus making it possible to simplify the process of manufacturing the ultraviolet detecting device.

Second Preferred Embodiment

Figure 10:
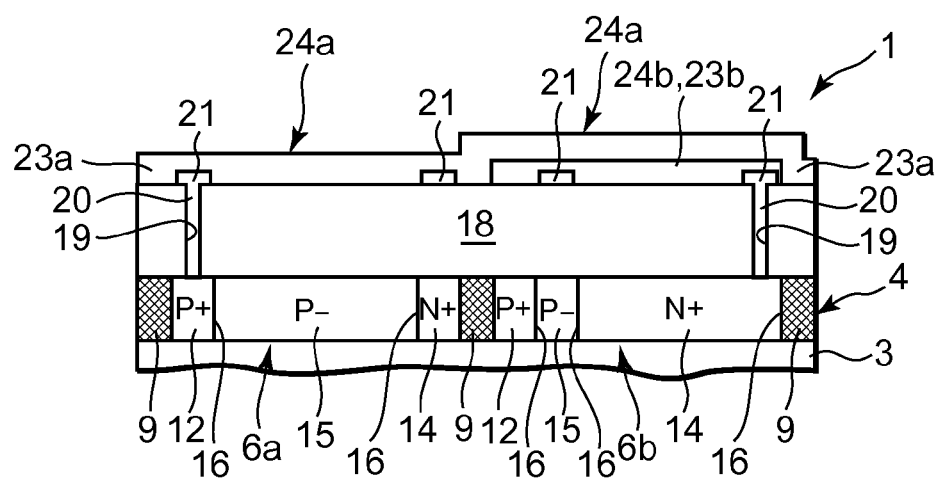
FIG. 10 is an explanatory diagram showing a section of an ultraviolet detecting device according to a second embodiment.
Figure 13:
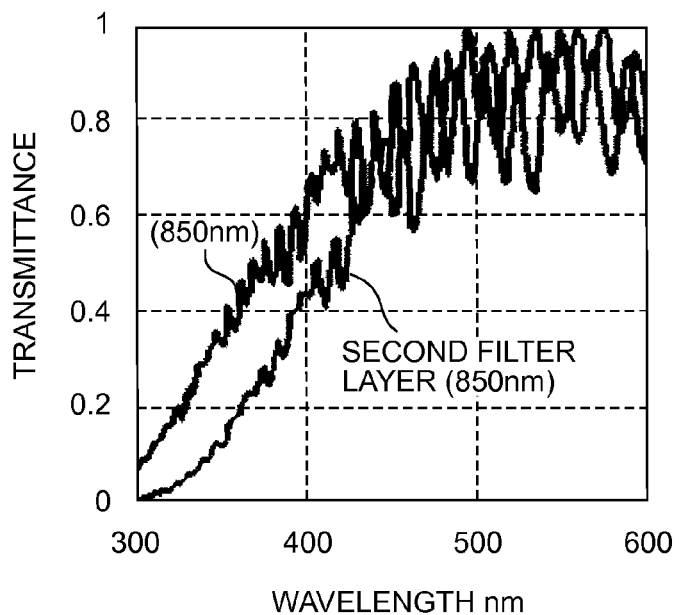
FIG. 13 is a graph showing an optical transmittance characteristic of a filter layer having a stacked structure according to the second embodiment.

FIG. 10 is an explanatory diagram showing a section of an ultraviolet detecting device according to a second embodiment, and FIGS. 11A to 11D and FIGS. 12A to 12B are respectively explanatory diagrams showing a method for manufacturing the ultraviolet detecting device according to the second embodiment.

Incidentally, FIG. 10 is a sectional view shown in section similar to FIG. 2 showing the first embodiment. Its upper surface is similar to FIG. 1 showing the first embodiment. The same reference numerals are attached to portions or elements similar to those in the first embodiment and the description thereof will therefore be omitted.

A first filter layer 24a is formed on a first photodiode 6a of the present embodiment with an interlayer insulating film 18 interposed therebetween.

A filter layer of stacked structure comprising a second filter layer 24b and the first filter layer 24a is formed over a second photodiode 6b with the interlayer insulating film 18 interposed therebetween.

The first filter layer 24a employed in the present embodiment is formed 450 nm in thickness, and the second filter layer 24b is formed 400 nm in thickness.

A silicon semiconductor layer 4 is formed to a thickness ranging from greater than or equal to 3 nm to less than or equal to 36 nm in a manner similar to the first embodiment. In the present embodiment, the silicon semiconductor layer is formed to a thickness of 35 nm.

A method for manufacturing the ultraviolet detecting device according to the present embodiment will be explained below in accordance with processes indicated by PA in FIGS. 11A to 11D and FIGS. 12A to 12B.

Since a process for forming a semiconductor wafer of SOI structure formed with plural lateral PN-junction type first and second photodiodes 6a and 6b in a silicon semiconductor layer 4 employed in the present embodiment, and operations at processes shown in FIGS. 11A to 11C are similar to those at the processes shown in FIGS. 3A to 3C in the first embodiment, their explanations are omitted.

At FIG. 11D, a second passivation film 23b of an about 400 nm-thick is formed over an interlayer insulating film 18 and wirings 21 in a manner similar to the process shown in FIG. 3A of the first embodiment.

At FIG. 12A, a second filter layer 24b having a size equal to a second diode forming area 7b opposite to a second photodiode 6b with the interlayer insulating film 18 interposed therebetween is formed by anisotropic etching in a manner similar to the process shown in FIG. 4A of the first embodiment.

At FIG. 12B, a first passivation film 23a of an about 450 nm-thick is formed over the interlayer insulating film 18 and wirings 21, and the second filter layer 24b in a manner similar to the process shown in FIG. 4B of the first embodiment.

Thus, a first filter 24a opposite to a first photodiode 6a with the interlayer insulating film 18 interposed therebetween is formed over the first photodiode 6a. The first filter layer 24a is stacked or laminated on the second filter layer 24b lying over the second photodiode 6b.

Thereafter, a resist mask having openings in areas for forming terminal holes lying on unillustrated pads is formed by photolithography. The terminal holes are formed by executing anisotropic etching plural times. The first filter layer 24a opposite to its corresponding first photodiode 6a with the interlayer insulating film 18 interposed therebetween is formed on the first photodiode 6a, whereby such an ultraviolet detecting device 1 as shown in FIG. 10 is formed in which the second filter layer 24b and the first filter layer 24a are stacked on the second photodiode 6b.

The first and second photodiodes 6a and 6b formed in this way do not react to visible light because they are formed in the corresponding silicon semiconductor layer 4 whose thickness ranges from greater than equal to 3 nm to less than or equal to 36 nm (35 nm in the present embodiment).

Since the first filter layer 24a that causes ultraviolet light and visible light lying in wavelength ranges of UV-A and UV-B waves to pass therethrough is formed thin (450 nm in the present embodiment) on the first photodiode 6a as compared with the first embodiment, the penetrated visible light is cut off by the thickness of the silicon semiconductor layer 4, so that the quantities of the ultraviolet light in the wavelength ranges of the UV-A and UV-B waves, particularly, the quantity of the ultraviolet light lying in the wavelength range of the UV-B wave can be detected much more (refer to FIG. 6).

Further, since the second filter layer 24b that allows the ultraviolet light and visible light lying in the wavelength range of the UV-A wave to pass therethrough is formed thin (400 nm in the present embodiment) on the second photodiode 6b as compared with the first embodiment, and a filter layer of stacked structure in which the first filter layer 24a formed thin as compared with the first embodiment is formed on the second filter layer 24b, is formed, the penetrated visible light is cut by the thickness of the silicon semiconductor layer 4 and thereby the quantity of the ultraviolet light lying in the wavelength range (from about 320 nm to 400 nm in wavelength) of the UV-A wave at the second photodiode 6b can be detected much more.

This is because the first filter layer 24a allows the UV-A wave to pass almost 100% without absorbing it (refer to FIG. 5) and the penetrated quantity of UV-A wave increases by making the second filter layer 24b thinner.

Thus, such an ultraviolet detecting device 1 as to be capable of separating and detecting the quantities of the ultraviolet light lying in the respective wavelength ranges of the UV-A and UV-B waves can be obtained in a manner similar to the first embodiment. Further, the quantity of the ultraviolet light in the wavelength range of the UV-A wave, which is detected by the second photodiode 6b, can be controlled by combinations of the thicknesses of the respective stacked filter layers.

Incidentally, the filter layer of stacked structure shown above makes it possible to increase the quantity of the ultraviolet light in the UV-A wave at the second photodiode 6b similar to the above even though the order in which the respective filter layers are stacked is set in reverse.

In this case, if the first filter layer 24a is stacked on the second filter layer 24b as in the present embodiment, then the passivation film that covers other area of the semiconductor wafer can be configured as the first passivation film 23a that allows ultraviolet light lying in a wavelength range (about 280 nm or less in wavelength) of an UV-C wave to pass therethrough albeit only slightly (refer to FIG. 5). The deletion or erasure of contents stored in a memory device or the like formed in other area of the semiconductor wafer can be easily conducted using an artificially produced UV-C wave. Since the UV-C wave produced from the sunlight is absorbed into the ozone layer and does not reach the ground even though done in this way, the stored contents of the mounted memory device do not disappear spontaneously.

In the present embodiment as described above, the quantity of the ultraviolet light lying in the wavelength range of the UV-A wave, which is detected by the second photodiode, can be controlled under the combinations of the thicknesses of the respective filter layers by forming the filter layer of stacked structure in which the first filter layer and the second filter layer are stacked on the second photodiode, in addition to an effect similar to the first embodiment.

Since the filter layer of stacked structure is configured in such a manner that the second filter layer is formed on the second photodiode side and the first filter layer is laminated on the second filter, the passivation film that covers other area of the semiconductor wafer can be configured as the first passivation film that allows the ultraviolet light lying in the wavelength range of the UV-C wave to pass therethrough. The deletion of the stored contents of the memory device or the like formed in other area of the semiconductor wafer can be easily conducted using the UV-C wave.

Third Preferred Embodiment

Figure 14:
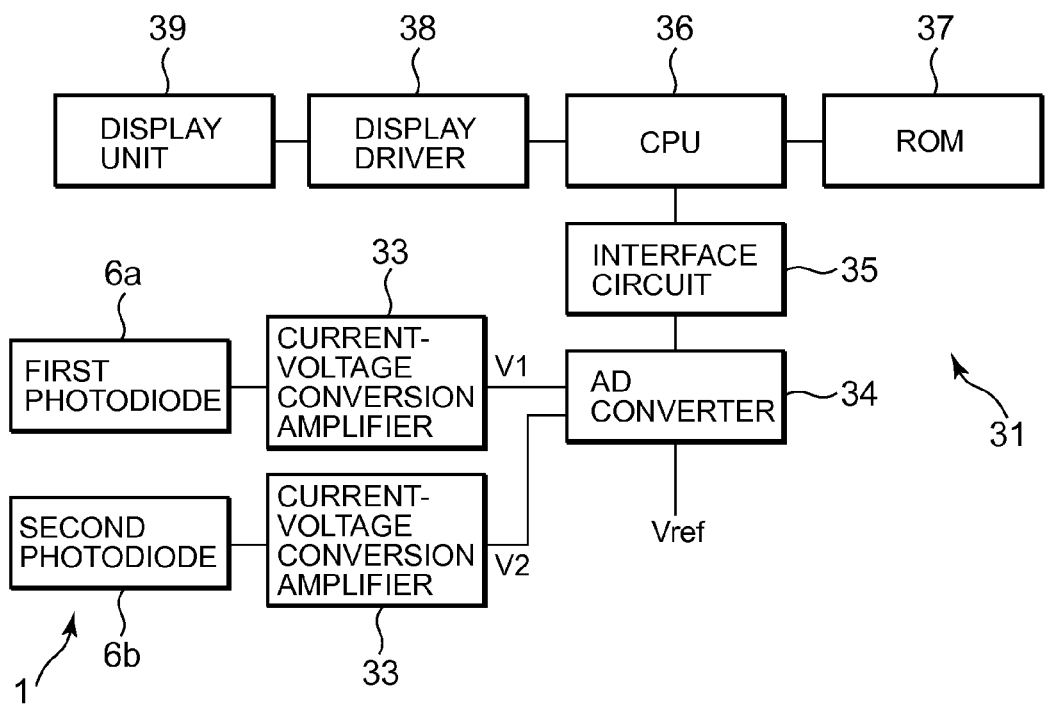
FIG. 14 is a block diagram showing an ultraviolet quantity measuring apparatus according to a third embodiment.
Figure 15:
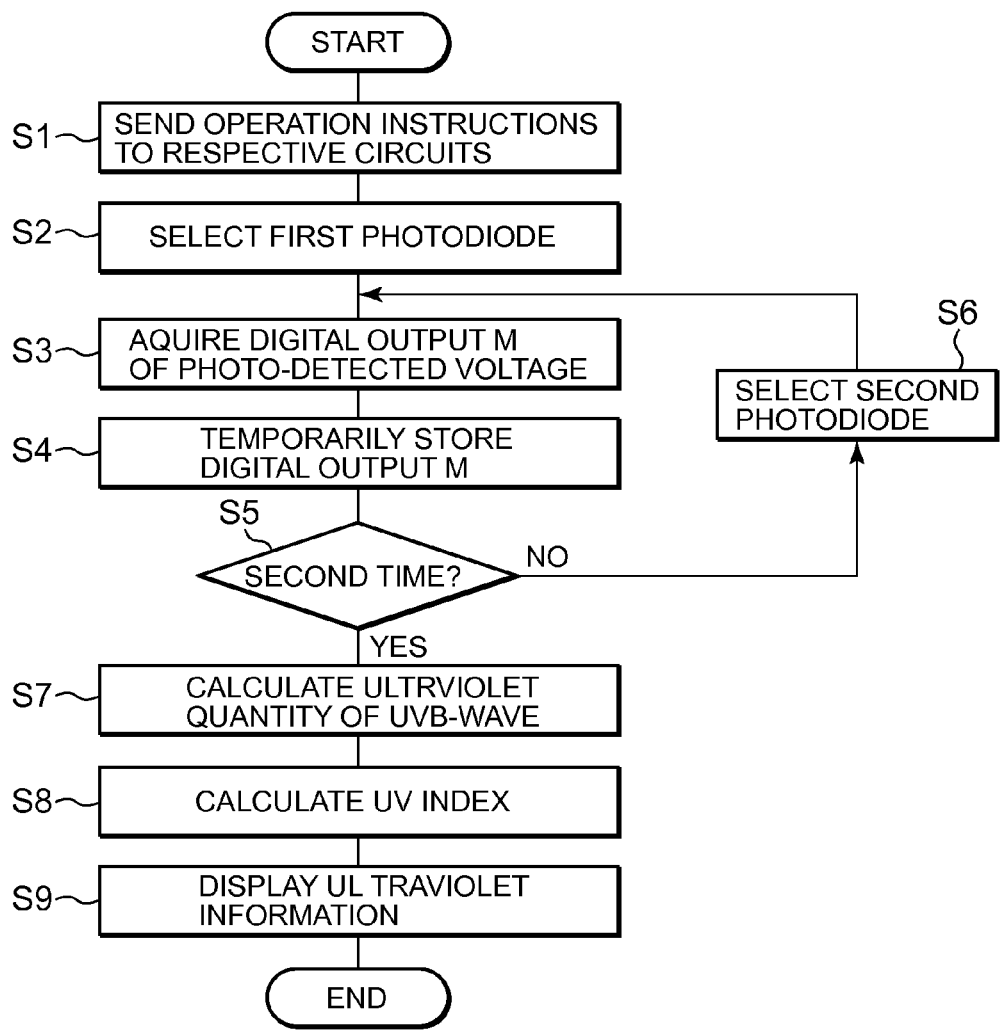
FIG. 15 is a flow chart illustrating an ultraviolet information measuring process according to the third embodiment.

FIG. 14 is a block diagram showing an ultraviolet quantity measuring apparatus according to a third embodiment, and FIG. 15 is a flow chart showing an ultraviolet information measuring process of the third embodiment, respectively.

Incidentally, the same reference numerals are attached to portions or elements similar to those in the first embodiment, and their explanations are omitted.

As shown in FIG. 14, the ultraviolet quantity measuring apparatus 31 of the present embodiment comprises a first photodiode 6a which selectively outputs the quantities of ultraviolet light lying in wavelength ranges of UV-A and UV-B waves as current values according to the thicknesses of a first filter layer 24a and a silicon semiconductor layer 4, a second photodiode 6b which selectively outputs the quantity of ultraviolet light lying in the wavelength range of the UV-A wave as a current value according to the thicknesses of a second filter layer 24b and the silicon semiconductor layer 4, current-voltage conversion amplifiers 33 which convert photoelectric currents outputted from the first and second photodiodes 6a and 6b into voltages and amplify the same and which outputs them as photo-detected voltages, a relatively high-accuracy AD converter 34 which has a resolution of 10 bits or more (12 bits in the present embodiment) and which builds therein a switching means such as an electronic switch or the like for performing switching between the photo-detected voltages outputted from the first and second photodiodes 6a and 6b upon sampling, a CPU 36 which has a built-in memory and controls the respective parts of the ultraviolet quantity measuring apparatus 31 through an interface circuit 35 and the like to execute an ultraviolet information measuring process or the like, a ROM 37 which stores therein a program, data and the like to be executed by the CPU 36, and a display unit 39 having a display screen, such as an LCD for displaying display data outputted from the CPU 36 via a display driver 38, etc. These respective parts of the ultraviolet quantity measuring apparatus 31 are formed integrally with the silicon semiconductor layer 4 of the same semiconductor wafer and manufactured as one LSI.

Figure 16:
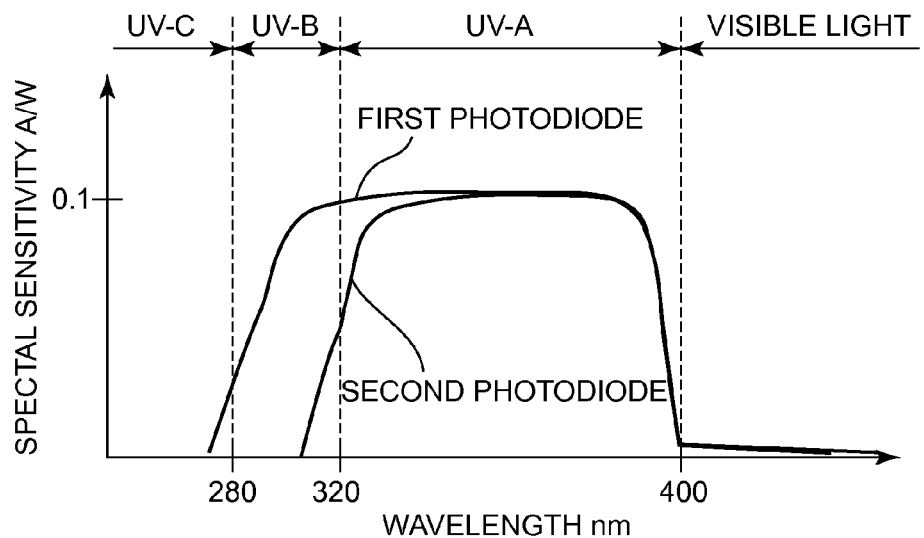
FIG. 16 is a graph showing spectral sensitivities of first and second photodiodes of an ultraviolet detecting device according to the third embodiment.

The ultraviolet detecting device 1 described in the first or second embodiment is used in the ultraviolet quality measuring apparatus 31 according to the present embodiment. As shown in FIG. 16, the first and second photodiode 6a and 6b are set in advance such that their photo-detecting areas are adjusted to equalize the generated amounts of photocurrents in the wavelength range of the UV-A wave.

The switching means of the AD converter 34 is switched to acquire digital outputs M1 and M2 of photo-detected voltages V1 and V2 outputted from the first and second photodiodes 6a and 6b. The quantity of ultraviolet light for the UV-A wave is determined from the acquired digital output M2 of the second photodiode 6b. The determined quantity of ultraviolet light is subtracted from the digital output M1 of the first photodiode 6a to calculate the quantity of ultraviolet light for the UV-B wave. The ultraviolet quantity of the UV-B wave is multiplied by an index constant to calculate an UV index. The quantities of ultraviolet light for these UV-A and UV-B waves, and an ultraviolet information measuring process program having the function of displaying ultraviolet information comprised of each UV index, and the like are stored in the ROM 37 of the present embodiment in advance. Respective functional means configured as hardware of the ultraviolet quantity measuring apparatus 31 of the present embodiment are formed by steps of the ultraviolet information measuring process program executed by the CPU 36.

Index constants determined based on sensitivities of the first and second photodiodes 6a and 6b to the ultraviolet light and their photo-detecting areas are set to and stored in the ROM 37 in advance to calculate UV indices.

The ultraviolet information measuring process of the present embodiment will be explained below in accordance with steps indicated by S using the flow chart shown in FIG. 15.

At S1, a user of the ultraviolet quantity measuring apparatus 31 presses an unillustrated measuring button under the sunlight when ultraviolet information is measured.

The CPU 36 that is enqueued in wait for the depression of the measuring button sends operation instructions to the respective parts of the ultraviolet quantity measuring apparatus 31 through the interface circuit 35 in accordance with the ultraviolet information measuring process program when the depression of the measuring button is detected, and thereby starts to measure the ultraviolet information.

At S2, the CPU 36 that has started the measurement of the ultraviolet information transmits a switching instruction to the AD converter 34. The AD converter 34 having received it switches its switching means to the first photodiode 6a.

At S3, the CPU 36 having switched the switching means to the first photodiode 6a sends a digital output acquisition instruction to the AD converter 34. The AD converter 34 having received it samples a photo-detected voltage V1 (refer to FIG. 15) obtained by causing the current-voltage conversion amplifier 33 to convert a photocurrent outputted from the first photodiode 6a into its corresponding voltage and holds it therein. Further, the AD converter 34 sends a digital output M1 generated while the held photo-detected voltage V1 is being compared with a reference voltage Vref (source voltage in the present embodiment, to the CPU 36 through the interface circuit 35.

Thus, the CPU 36 acquires the digital output M1 of the photo-detected voltage V1 outputted from the AD converter 34.

At S4, the CPU 36 having acquired the digital output M1 temporarily stores a digital output M1 obtained by converting the photo-detected voltage V1 into digital form in the built-in memory.

At S5, when the photo-detected voltage stored in the built-in memory is of a digital output based on a first sampling, the CPU 36 determines that a second sampling is required and proceeds to Step S6. In the case of the second sampling, the CPU 36 determines the completion of sampling and proceeds to Step S7.

At S6, the CPU 36 having determined that the second sampling is required transmits a switching instruction to the AD converter 34. The AD converter 34 that has received it switches its switching means to the second photodiode 6b.

Then, the CPU 36 samples a photo-detected voltage V2 from the second photodiode 6b to acquire a digital-converted digital output M2 from the AD converter 34 in accordance with Steps S3 and S4 and temporarily stores the acquired digital output M2 of the photo-detected voltage V2 in the built-in memory.

At S7, the CPU 36 having determined the completion of sampling of the ultraviolet quantities based on the first and second photodiodes 6a and 6b reads the respective digital outputs M1 and M2 of the photo-detected voltages V1 and V2 temporarily stored in the built-in memory. Then, the CPU 36 determines the ultraviolet quantity of an UV-A wave from the digital output M2 produced from the second photodiode 6b which outputs the quantity of ultraviolet light lying in the wavelength range of the UV-A wave, and subtracts the digital output M2 from the digital output M1 outputted from the first photodiode 6a which outputs the quantities of ultraviolet light in the wavelength ranges of the UV-A and UV-B waves, thereby calculating the ultraviolet quantity of the UV-B wave.

At S8, the CPU 36 that has calculated the ultraviolet quantity of the UV-B wave reads the corresponding index constant stored in the ROM 37 and multiplies the calculated ultraviolet quantity of UV-B wave by the index constant to calculate the corresponding UV index.

At S9, the CPU 36 generates display data on ultraviolet information, based on the calculated UV index and the ultraviolet quantities of the UV-A and UV-B waves and sends it to the display driver 38 to display the measured ultraviolet information on the display screen of the display unit 39.

Thereafter, the CPU 36 transmits a stop or halt instruction to the respective parts of the ultraviolet quantity measuring apparatus 31 to terminate the ultraviolet information measuring process and returns to Step S1, where it stands by in wait for the depression of the measuring button.

Thus, in the ultraviolet information measuring process of the present embodiment, the first photodiode 6a which selectively outputs the quantities of the ultraviolet light lying in the wavelength ranges of the UV-A and UV-B waves, and the second photodiode 6b which selectively outputs the quantity of the ultraviolet light lying in the wavelength range of the UV-A wave, are set such that the generated amounts of photocurrents in the wavelength range of the UV-A wave become identical. The quantity of the ultraviolet light from the second photodiode 6b is subtracted from the quantity of the ultraviolet light from the first photodiode 6a to calculate the ultraviolet quantity of the UV-B wave. The calculated ultraviolet quantity is multiplied by the index constant to calculate the corresponding UV index. It is therefore possible to measure the ultraviolet information easily.

Since the ultraviolet quantity measuring apparatus 31 of the present embodiment is manufactured using the first and second photodiodes 6a and 6b formed in the silicon semiconductor layer 4, the AD converter 34, the CPU 36 and the like can be formed integrally with the silicon semiconductor layer 4. As compared with the case in which an ultraviolet detecting device manufactured by another substrate as in an ultraviolet detecting device formed by a complex compound comprised of aluminum, gallium (Ga) and nitrogen (N), and an LSI formed with the AD converter 34, the CPU 36 and the like are combined together, the ultraviolet quantity measuring apparatus 31 can be formed on a single chip basis. The manufacturing cost of the ultraviolet quantity measuring apparatus 31 can be reduced or cut down, and the ultraviolet quantity measuring apparatus 31 can be miniaturized.

Incidentally, although the present embodiment has described that the generated amounts of photocurrents in the wavelength range of the UV-A wave at the first and second photodiodes 6a and 6b are set identical, the predetermined magnifying power is set in such a manner that the generated amount of photocurrent in the wavelength range of the UV-A wave at the second photodiode 6b becomes identical to the generated amount of photocurrent in the wavelength range of the UV-A wave at the first photodiode 6a. The output of the second photodiode 6b is then multiplied by the predetermined magnifying power. In this state, the generated amounts of photocurrents in the wavelength range of the UV-A wave at the first and the second photodiodes may be set identical.

In the present embodiment as described above, the ultraviolet detecting device of the first or second embodiment is used, and the ultraviolet quantity of the UV-A wave is determined from the output of the second photodiode thereof. The output of the second photodiode is subtracted from the output of the first photodiode thereby to determine the ultraviolet quantity of the UV-B wave. Consequently, the ultraviolet information can easily be measured and besides the ultraviolet quantity measuring apparatus can be formed on a single LSI basis. Further, the manufacturing cost of the ultraviolet quantity measuring apparatus can be cut down, and the ultraviolet quantity measuring apparatus can be miniaturized.

Figure 17:
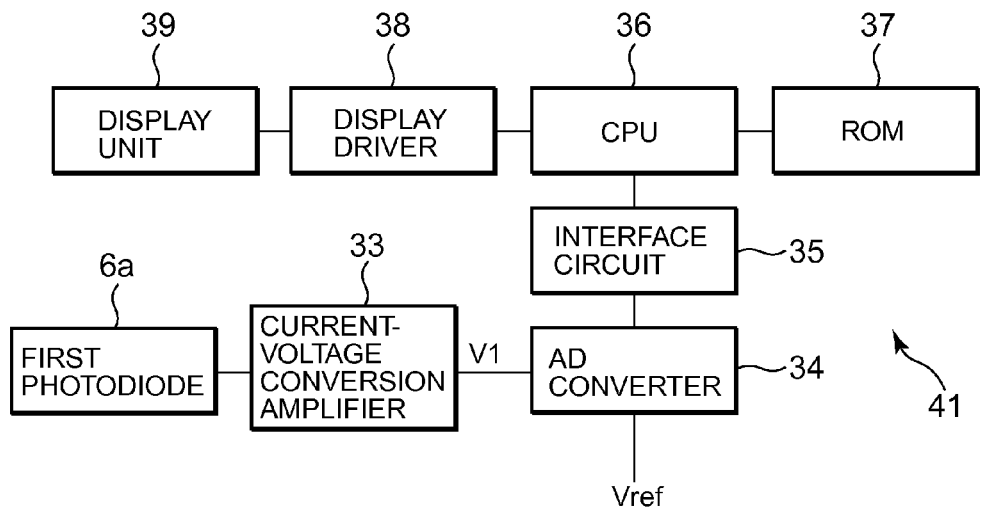
FIG. 17 is a block diagram illustrating an ultraviolet quantity measuring apparatus according to a fourth embodiment.
Figure 18:
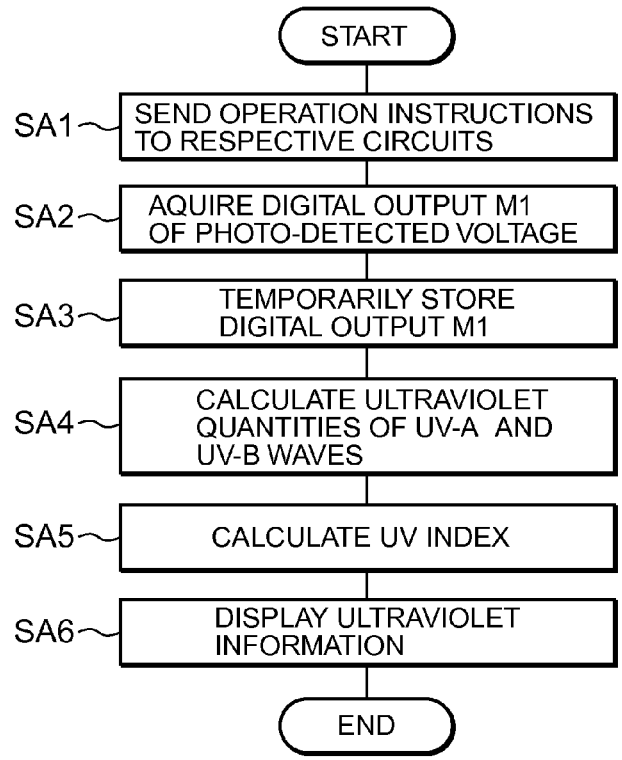
FIG. 18 is a flow chart showing an ultraviolet information measuring process according to the fourth embodiment.

Incidentally, although the first through third embodiments have described that the first and second photodiodes of the ultraviolet detecting device are formed adjacent to each other, it is not necessary to provide them adjacent to each other, and it is enough if they are disposed within an LSI Fourth Preferred Embodiment FIG. 17 is a block diagram showing an ultraviolet quantity measuring apparatus according to a fourth embodiment, and FIG. 18 is a flow chart showing an ultraviolet information measuring process of the fourth embodiment, respectively.

Incidentally, the same reference numerals are attached to portions or elements similar to those in the first and third embodiments, and their explanations are omitted.

As shown in FIG. 17, the ultraviolet quantity measuring apparatus 41 of the present embodiment makes use of only the first photodiode 6a of the ultraviolet detecting device 1 described in the first or second embodiment, which outputs, as current values, the quantities of ultraviolet light in wavelength ranges of UV-A and UV-B waves according to the thicknesses of a first filter layer 24a and a silicon semiconductor layer 4. The ultraviolet quantity measuring apparatus 41 comprises a current-voltage conversion amplifier 33 similar to the third embodiment, an AD converter 34 similar to the third embodiment from which the switching means is omitted, and an interface circuit 35, a CPU 36, a ROM 37, a display driver 38 and a display unit 39 similar to the third embodiment, etc. These respective parts of the ultraviolet quantity measuring apparatus 41 are formed integrally with the silicon semiconductor layer 4 of the same semiconductor wafer and manufactured as one LSI.

A digital output M1 of a photo-detected voltage V1 of the first photodiode 6a, which is acquired from the AD converter 34, is multiplied by an A-wave ratio to calculate the ultraviolet quantity of the UV-A wave. The digital output M1 is multiplied by a B-wave ratio to calculate the ultraviolet quantity of the UV-B wave. An ultraviolet information measuring process program having the function of displaying ultraviolet information about these, and the like is stored in the ROM 37 of the present embodiment in advance. Respective functional means configured as hardware of the ultraviolet quantity measuring apparatus 41 of the present embodiment are formed by steps of the ultraviolet information measuring process program executed by the CPU 36.

In addition to index constants similar to the third embodiment, the A-wave ratio for calculating the ultraviolet quantity of the UV-A wave from the digital output M1 of the photo-detected voltage V1 of the first photodiode 6a, and the B-wave ratio for calculating the ultraviolet quantity of the UV-B wave from the digital output M1 are set to and stored in the ROM 37 in advance.

Such A-wave and B-wave ratios are set in the following manner using the characteristic that although the spectral sensitivity of the first photodiode 6a, which is shown in FIG. 16, changes in absolute value depending on the condition of irradiation of the sunlight due to the weather or the like, the ratio between an A-wave integral value obtained by integrating the spectral sensitivity of the UV-A wave over its wavelength range, and a B-wave integral value obtained by integrating the spectral sensitivity of the UV-B wave over its wavelength range remains unchanged.

$$A\text{-wave ratio}=A\text{-wave integral value}/(A\text{-wave integral value}+B\text{-wave integral value}) \quad (3)$$

$$B\text{-wave ratio}=B\text{-wave integral value}/(A\text{-wave integral value}+B\text{-wave integral value}) \quad (4)$$

The ultraviolet information measuring process of the present embodiment will be explained below in accordance with steps indicated by SA using the flow chart shown in FIG. 18.

At SA1, a user of the ultraviolet quantity measuring apparatus 41 presses an unillustrated measuring button under the sunlight when ultraviolet information is measured.

The CPU 36 that is enqueued in wait for the depression of the measuring button sends operation instructions to the respective parts of the ultraviolet quantity measuring apparatus 41 through the interface circuit 35 in accordance with the ultraviolet information measuring process program when the depression of the measuring button is detected, and thereby starts to measure the ultraviolet information.

At SA2, the CPU 36 that has started the measurement of the ultraviolet information transmits a digital output acquisition instruction to the AD converter 34. The CPU 36 acquires a digital output M1 of a photo-detected voltage V1 outputted from the AD converter 34 in a manner similar to Step S3 of the third embodiment.

At SA3, the CPU 36 having acquired the digital output M1 temporarily stores a digital output M1 obtained by converting the photo-detected voltage V1 into digital form in a memory built therein.

At SA4, the CPU 36 reads the digital output M1 of the photo-detected voltage V1 temporarily stored in the built-in memory and reads the A-wave and B-wave ratios stored in the ROM 37. Then, the CPU 36 multiplies the digital output M1 by an A-wave ratio to calculate the ultraviolet quantity of an UV-A wave and multiplies the digital output M1 by a B-wave ratio to calculate the ultraviolet quantity of an UV-B wave.

Thus, the ultraviolet quantity of the UV-A wave and the ultraviolet quantity of the UV-B wave both obtained by dividing the output of the first photodiode 6a by a predetermined ratio are calculated.

At SA5, the CPU 36 having calculated the ultraviolet quantity of the UV-B wave calculates an UV index in a manner similar to Step S8 of the third embodiment.

At SA6, the CPU 36 displays the measured ultraviolet information on the display screen of the display unit 39 in a manner similar to Step S9 of the third embodiment.

Thereafter, the CPU 36 transmits a stop or halt instruction to the respective parts of the ultraviolet quantity measuring apparatus 41 to terminate the ultraviolet information measuring process and returns to Step SA1, where it stands by in wait for the depression of the measuring button.

Thus, in the ultraviolet information measuring process of the present embodiment, the output of the first photodiode 6a which selectively outputs the quantities of the ultraviolet light lying in the wavelength ranges of the UV-A and UV-B waves, is multiplied by the preset A-wave and B-wave ratios respectively to calculate the ultraviolet quantities of the UV-A and UV-B waves respectively. The calculated ultraviolet quantity of UV-B wave is multiplied by the index constant to calculate the UV index. Therefore, the ultraviolet information can be measured easier, and all ultraviolet information can be calculated by an arithmetic operation based on one-time sampling. It is thus possible to shorten the measuring time of the ultraviolet quantity measuring apparatus 41.

Since the ultraviolet quantity measuring apparatus 41 of the present embodiment is manufactured using the first photodiodes 6a formed in the silicon semiconductor layer 4, the ultraviolet quantity measuring apparatus 41 can be formed on a one-chip basis in a manner similar to the third embodiment, the manufacturing cost of the ultraviolet quantity measuring apparatus 41 can be cut down, and the ultraviolet quantity measuring apparatus 41 can further be miniaturized.

In the present embodiment as described above, the first photodiode of the ultraviolet detecting device according to the first or second embodiment is used and the output thereof for the UV-A and UV-B waves is divided by a predetermined ratio comprising the A-wave ratio and the B-wave ratio thereby to calculate the ultraviolet quantities of the UV-A and UV-B waves, whereby the ultraviolet information can be measured easier. Besides, the ultraviolet quantity measuring apparatus can be formed on a single LSI basis, the manufacturing cost of the ultraviolet quantity measuring apparatus can be cut down, and the ultraviolet quantity measuring apparatus can be further miniaturized.

In addition to the above, all ultraviolet information can be calculated by one-time sampling, and the measuring time of the ultraviolet quantity measuring apparatus can be shortened.

Incidentally, although the third embodiment and the present embodiment have explained the reference voltage Vref of the AD converter 34 as the source voltage, the reference voltage Vref may be a voltage generated inside the LSI for digital conversion.

Although the third embodiment and the present embodiment have described that the digital output M1 and the like are stored in the internal memory built in the CPU 36, they may be stored in an external memory provided outside the CPU 36.

Although each of the above embodiments has described that the low-concentration diffusion layer is formed by diffusing the P-type impurity, an effect similar to the above can be obtained even though the low-concentration diffusion layer is formed by diffusing an N-type impurity in a relatively low concentration.

Although each of the above embodiments has described that the P+ diffusion layer is shaped in the form of "π" and the N+ diffusion layer is shaped in the form of "E", their shapes may be reversed or the number of comb teeth portions may be further increased.

Further, although each of the above embodiments has described that the plural comb teeth portions are provided in the P+ diffusion layer and the N+ diffusion layer and disposed in engagement with one another, only the ridge portions may be disposed opposite to each other with the low-concentration diffusion layer being interposed therebetween without providing the comb teeth portions.

Furthermore, although each of the above embodiments has explained the semiconductor wafer as the semiconductor wafer of SOI structure having the silicon semiconductor layer formed in the silicon substrate with the embedded oxide film used as the insulating layer being interposed therebetween, the semiconductor wafer of SOI structure is not limited to the above, but may be a semiconductor wafer of SOI structure such as an SOS (Silicon On Sapphire) substrate in which a silicon semiconductor layer is formed on a sapphire substrate used as an insulating layer, an SOQ (Silicon On Quartz) substrate in which a silicon semiconductor layer is formed on a quartz substrate used as an insulating layer, or the like.

While the preferred forms of the present invention have been described, it is to be understood that modifications will be apparent to those skilled in the art without departing from the spirit of the invention. The scope of the invention is to be determined solely by the following claims.

What is claimed is:

1. The ultraviolet detecting device comprising:
    a silicon semiconductor layer having a thickness ranging from greater than or equal to 3 nm to less than or equal to 36 nm, said silicon semiconductor layer being formed over an insulating layer;
    lateral PN-junction type first and second photodiodes formed in the silicon semiconductor layer;
    an interlayer insulating film formed over the silicon semiconductor layer;
    a first filter layer made of silicon nitride, said first filter layer being formed over the interlayer insulating film provided over the first photodiode and allowing light lying in a wavelength range of an UV-B wave or higher to pass therethrough; and
    a second filter layer made of silicon nitride, said second filter layer allowing light lying in a wavelength range of an UV-A wave or higher to pass therethrough,
    wherein the first filter layer and the second filter layer are stacked over the second photodiode with the interlayer insulating film interposed therebetween.

2. The ultraviolet detecting device according to claim 1, wherein of the stacked first and second filter layers, the second filter layer is formed on the second photodiode side, and the first filter layer is stacked over the second filter layer.

* * * * *